United States Patent
Loy et al.

[11] Patent Number: 5,966,010
[45] Date of Patent: Oct. 12, 1999

[54] ELECTRICAL ENERGY METER WITH SNAP FIT INTERLOCKING PARTS

[75] Inventors: Garry Melvin Loy; Rodney C. Hemminger, both of Raleigh; Russell C. Broome, Garner; Mark L. Munday, Raleigh, all of N.C.

[73] Assignee: ABB Power T&D Company Inc., Raleigh, N.C.

[21] Appl. No.: 09/020,797

[22] Filed: Feb. 9, 1998

[51] Int. Cl.$^6$ .............................. G01R 11/32; H02B 1/00
[52] U.S. Cl. .................... 324/142; 324/127; 324/141; 361/659; 361/664
[58] Field of Search ..................... 324/141, 142, 324/127, 107; 702/60, 61, 62; 361/659, 664, 666, 667, 668; 343/741, 866; 340/870.11, 870.02, 870.03

[56] References Cited

U.S. PATENT DOCUMENTS

| | | |
|---|---|---|
| 1,919,213 | 7/1933 | Emens . |
| 1,969,499 | 8/1934 | Bradshaw et al. ..................... 171/34 |
| 2,313,881 | 3/1943 | Lewis ..................... 220/24 |
| 2,402,360 | 6/1946 | Bevins ..................... 220/82 |
| 3,001,668 | 9/1961 | Burk et al. ..................... 220/82 |
| 3,707,653 | 12/1972 | Coffey et al. ..................... 317/120 |
| 4,368,943 | 1/1983 | Davis et al. ..................... 339/198 |
| 4,556,844 | 12/1985 | Wason ..................... 324/156 |
| 4,783,623 | 11/1988 | Edwards et al. ..................... 324/156 |
| 5,066,906 | 11/1991 | Moore ..................... 324/142 |
| 5,089,771 | 2/1992 | Tanguay et al. ..................... 324/142 |
| 5,270,639 | 12/1993 | Moore ..................... 324/142 |
| 5,473,504 | 12/1995 | Horan et al. ..................... 361/667 |
| 5,577,933 | 11/1996 | Robinson et al. ..................... 439/517 |

Primary Examiner—Joise Ballato
Assistant Examiner—Russell M. Kobert
Attorney, Agent, or Firm—Woodcock Washburn Kurtz Mackiewicz & Norris LLP

[57] ABSTRACT

An electrical energy meter is provided with snap fit interlocking parts that eliminate the need for screws or fasteners. The current sensor, located within the meter, has a plurality of current conductors and a notched blade attached to each current conductor that functions as an interlocking component to the meter base without the need for additional fasteners. A circuit board used by the meter is attached to a plurality of integral posts projecting from the base and the periphery of the circuit board has a pair of spaced notches for connection to the ends of a radial communications antenna without the requirement for additional hardware.

15 Claims, 8 Drawing Sheets

ELECTRICAL ENERGY METER WITH SNAP FIT INTERLOCKING PARTS

FIELD OF THE INVENTION

The present invention relates to solid state and electro-mechanical residential electrical energy meters and, more particularly, to an electrical energy meter with snap fit interlocking parts for ease in assembly.

BACKGROUND OF THE INVENTION

Electrical energy meters are complex devices, which must meet certain American National Standards in order to be compatible with the existing network of electrical distribution equipment. All of these standards regulate design, materials, and use. They also limit the freedom of the designer who must work with the available materials and processes associated with existing electrical energy meter design.

Both the solid state and elector-mechanical residential electrical energy meters of the prior art make generous use of mechanical fasteners such as screws, rivets, eyelets and pins in the assembly of the mechanical package. The large number of different parts used in the typical meter assembly is one of the major cost factors in manufacturing. Using automated assembly equipment has made it possible to manufacture these more complicated meter designs at a reasonable cost only because of the high volume of meters produced.

The majority of electrical energy meters available commercially today utilize thermoset-molding materials for the meter base. Thermoset materials are very hard and brittle, requiring the meter base to have heavy cross sections in order to withstand the impact loads sustained by the meter during shipping and installation. Thermoset material limits the meter design because it is too rigid to support new design features that require resiliency and durability.

It would be desirable to utilize thermoplastic materials in the design of an electrical meter so as to provide flexible yet sturdy construction. In addition to the electrical and thermal properties which are prevalent in thermoses, these flameretardant reinforced, thermoplastic materials also possess excellent mechanical properties. Such mechanical properties enable the design of an electric meter to incorporate snap fit features into a mechanically sound electrical enclosure with high impact strength. It is an object of the present invention to provide a new and unique electrical meter which functions for its intended purpose while significantly reducing the number of parts, simplifying the assembly, and reducing overall product and manufacturing costs. It is a further object of the invention to provide an electrical energy meter with snap fit interlocking parts which eliminates the needs for screws or fasteners.

SUMMARY OF THE INVENTION

In accordance with the present invention there is provided an electrical energy meter with snap fit interlocking parts for ease in assembly. The meter includes a current sensor assembly having at least one annular current sensor with a central opening and a plurality of current conductors, at least one extending through the central opening in the current sensor. A plurality of meter blades are attached to the ends of the current conductors, each of the meter blades having notches on opposite edges thereof. The meter includes a thermoplastic meter base having a plurality of keyhole slots therethrough corresponding to the plurality of meter blades, each of the slots having a first section shaped to receive a meter blade and an adjacent narrow section shaped to receive the spaced notches on the meter blades to prevent the meter blades from moving axially of the base. The meter base has a plurality of integral posts projecting therefrom, the base posts having snap structure adjacent the outer ends thereof. The snap structure is shaped to support a circuit board of the electrical energy meter. A circuit board is supported on the snap structure. A pair of spaced notches are located on the periphery of the circuit board and a radial communications antenna having openings on the opposite ends thereof is attached to the notches on the periphery of the circuit board.

Further in accordance with one aspect of the invention the meter further includes a thermoplastic container having a plurality of meter blade lock keys shaped to fit within the first sections of the plurality of slots through the meter base. Two pairs of thermoplastic posts project from the retainer and are positioned between opposed pairs of meter blade lock keys, each of the retainer posts having hook shaped ends adapted to snap fit within corresponding openings in the meter base to lock the retainer and the meter base together. An insulation blade post projects from a central portion of the retainer for extension through the current sensor and between the current conductors to provide electrical insulation between the current conductors. The meter base posts extend through corresponding openings in the retainer and the base posts have first and second level snap structure adjacent the outer ends thereof. The first level snap structure is shaped to support the circuit board of the electrical energy meter and the second level snap structure is shaped to support a name plate.

The meter is provided with a thermoplastic cup-shaped cover having a rim at the open end thereof. The meter base is provided with inclined cam structure on the periphery thereof for cooperation with the rim on the cover the rim on the cover has cam structure for engaging the inclined cam structure on the base for locking the cover to the base when the cover is twisted relative to the base to enclose the name plate, antenna, circuit board and current sensor assembly therebetween.

For a more detailed understanding of the invention, reference is made to the accompanying figures of the drawings.

DESCRIPTION OF THE PREFERRED EMBODIMENT

Figure 1:
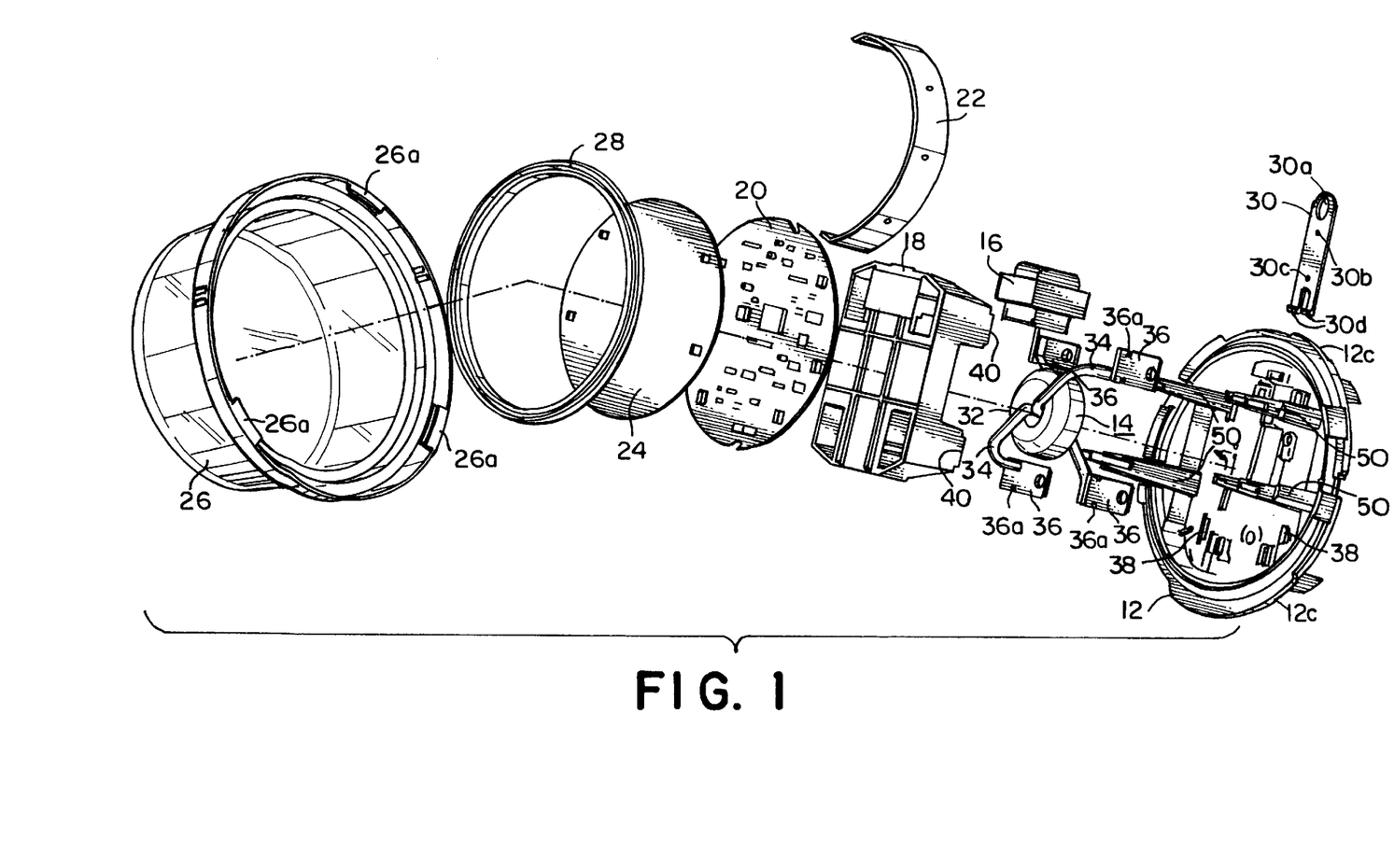
FIG. 1 is an exploded view of an electrical energy meter according to the present invention.

Referring to FIG. 1 there is shown an exploded view of an electrical energy meter 10 embodying the present invention. The meter 10 includes a thermoplastic base 12, a current sensor assembly 14 and a power transformer 16 which are mounted on the base 12 by a thermoplastic retainer 18, as later to be described. The meter 12 also includes a circuit board 20 a radio communications antenna 22 mounted thereon and a name plate 24. A cup shaped cover 26 and a sealing gasket 28 cooperate with the base 12 to form an enclosed housing for the parts of the meter referred to above. A hanger 30 is also provided for the meter for the purpose hereinafter to be described.

The meter base 12 is designed to meet ANSI standards. The meter base 12 is molded from a reinforced thermoplastic material having the required mechanical, electrical, and thermal properties, flammability rating, UV stabilization, and resistance to common solvents such as insecticides and cleaning solutions. An example of such thermoplastic material is a polyketone or PBT.

Figure 2A:
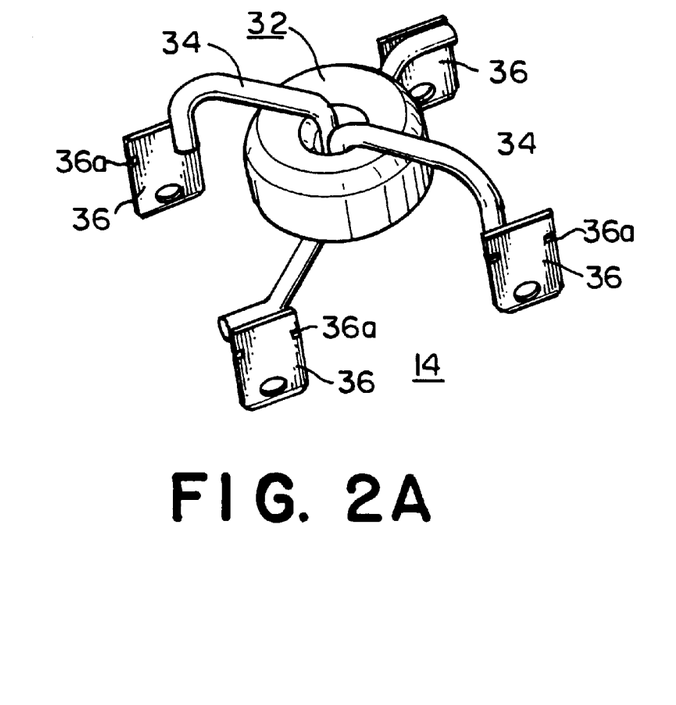
FIG. 2A is a perspective view of the current sensor assembly.
Figure 2B:
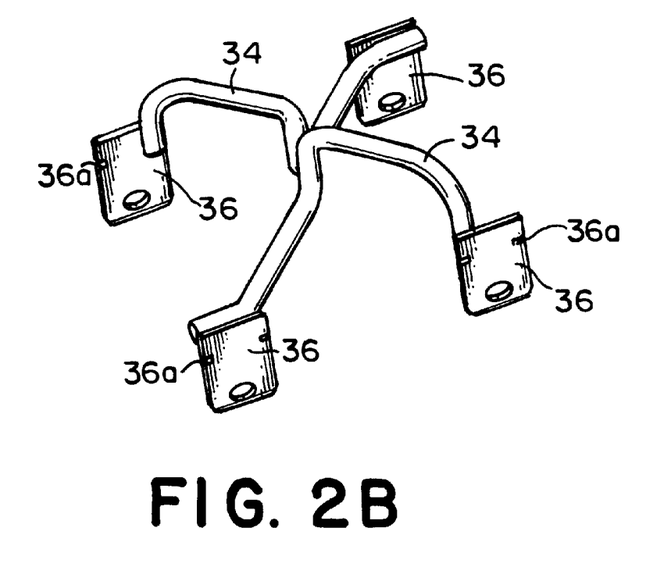
FIG. 2B is a perspective view of the current conductors and meter blades with the current sensor omitted.

Mounted centrally of the meter base 12 is the current sensor assembly 14, FIGS. 1 and 2A which comprises an annular current sensor 32 having a central opening through which extend current conductors 34, 34. The current conductors 34, 34 have meter blades 36, 36 connected to the opposite ends thereof and are identical in configuration, FIG. 2B. The current sensor 32 is used by the meter 10 to detect the quantity of current flow through the meter. The current conductors 34, 34 are the wires that pass the meter current through the current sensor 32. Most solid state and electromechanical residential electrical energy meters use separate left-hand and right-hand configurations for the current conductors. In the present invention a single configuration for the conductors 34, 34 has been developed which can be used for both left-hand and right-hand conductors. See FIG. 2B. The benefits of this conductor design are two fold: the shortest possible length of current conductor wire 34 results in a more direct connection between the meter connections or meter blades 36, and in the lowest temperature rise in the meter at full-rated current flow. The shortest possible length of wire also results in the lowest cost to manufacture the current sensor assembly. The current sensor assembly 14 of the present invention also accomplishes out of phase current detection. The source-side of the left-hand conductor and the load-side of the right-hand conductor create a sum of current in the current sensor using the same blade.

The electrical energy meter 10 of the present invention utilizes a new and unique arrangement for retaining the meter blades 36 of the current sensor assembly 14 in the meter base 12. In most solid state and elector-mechanical residential energy meters of the prior art the current conductors are attached to the meter base using cotter pins. These cotter pins are inserted through holes in the blades from the back side of the meter after assembly has taken place. Such an arrangement requires extra parts as well as adding an extra step to the meter assembly because the meter base much be turned over to insert the cotter pins.

Figure 8:
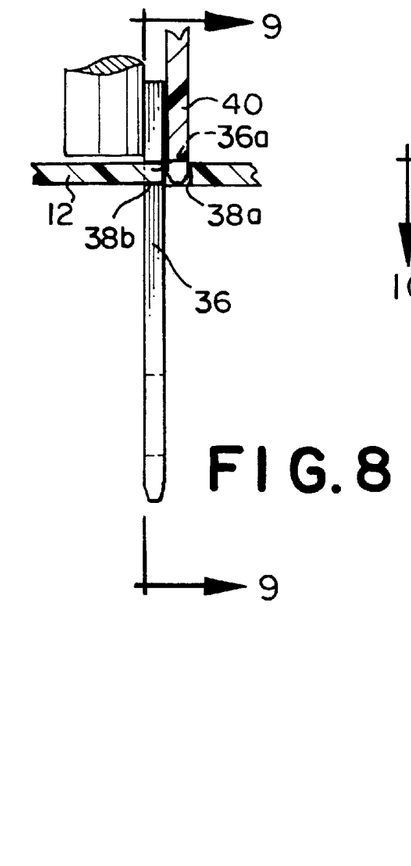
FIG. 8 is a sectional view on enlarged scale taken along the lines 8—8 in FIG. 6.
Figure 9:
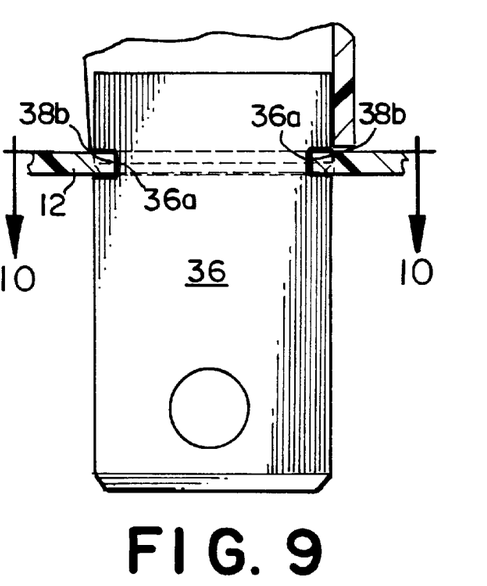
FIG. 9 is a view taken along the lines 9—9 in FIG. 8.
Figure 10:
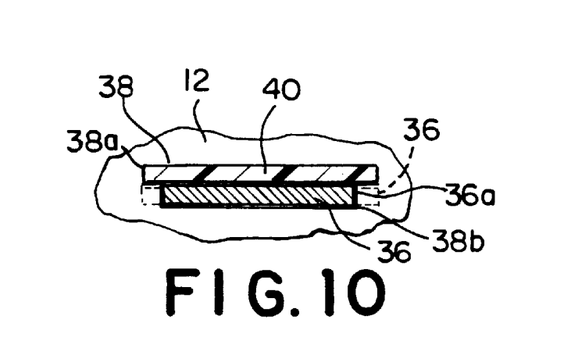
FIG. 10 is a sectional view taken along the lines 10—10 in FIG. 9.

In the present invention, the meter blades 36 with the current conductors 34 are retained in the meter base 12 by an interlocking blade system now to be described. This system consists of interlocking notches 36a on the sides of the blades 36 FIGS. 2A and 2B, that engage and lock within keyhole slots 38 FIG. 5, in the meter base 12. The keyhole slots 38 are formed by two adjacent rectangular openings 38a, 38b. The large rectangular opening 38a is sized so that the full area of the blade 36 fits within the large rectangular hole. Likewise, the small rectangular opening 38b (located adjacent to the large opening) is sized so that the narrow area of the blade 36 between the notches 36a rests within the small rectangular hole 38b. See FIGS. 5, 9 and 10. After the blades 36 are inserted into the large opening 38a in the keyhole slots 38 they are moved laterally into a final position in the smaller opening 38b which engages the interlocking notches 36a, FIGS. 6, 9 and 10. As hereinafter described, four meter retainer lock keys 40, FIGS. 1 and 4 on the retainer 18, once inserted into the remaining opening 38, FIGS. 8 and 10, secures the current sensor assembly 14 to the base 12.

As pointed out above, the meter base 12 is molded from a thermoplastic material that does not compromise properties needed to meet other requirements in order to retain the blades, 36. The new construction of the present invention is far superior to the residential meters traditional method of using cotter pins. The traditional method requires that the meter blades have additional features, which limit blade insertion; special blade washers and gaskets are necessary to evenly distribute the electrical load on the system during use. The interlocking blade notches on the present meter eliminate the need for additional parts. The new meter blade design is simpler, and no additional fasteners are required.

Figure 3:
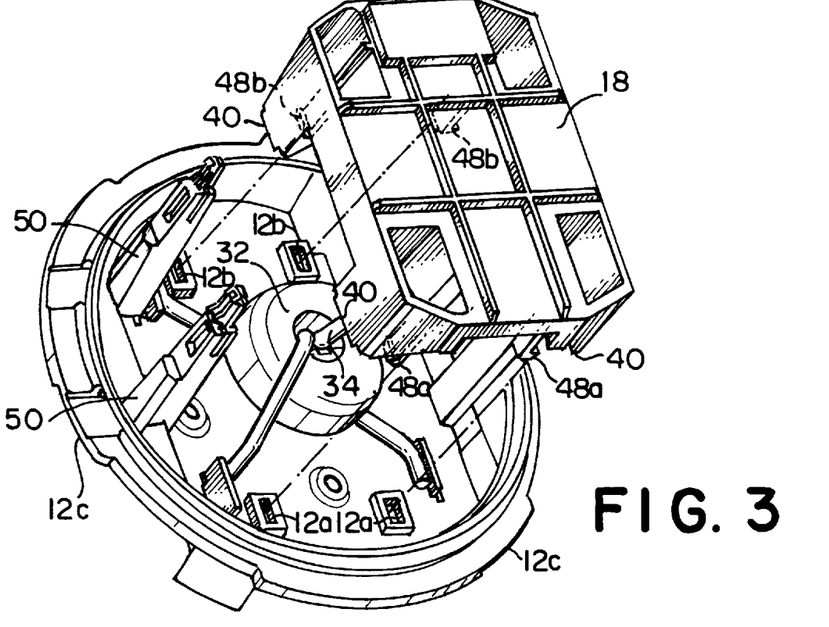
FIG. 3 is an exploded perspective view of the base and the retainer shown in FIG. 1.
Figure 4:
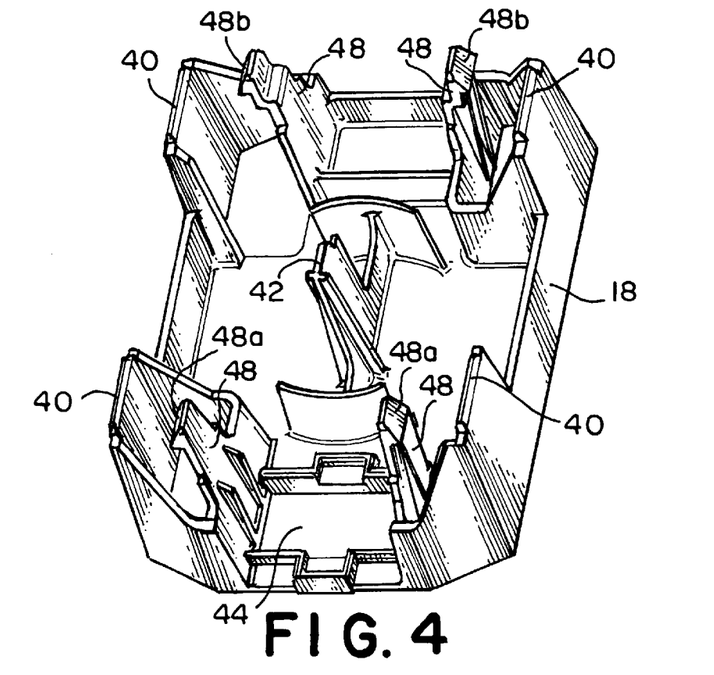
FIG. 4 is a perspective view of the retainer shown in FIG. 3 but from the opposite side.
Figure 5:
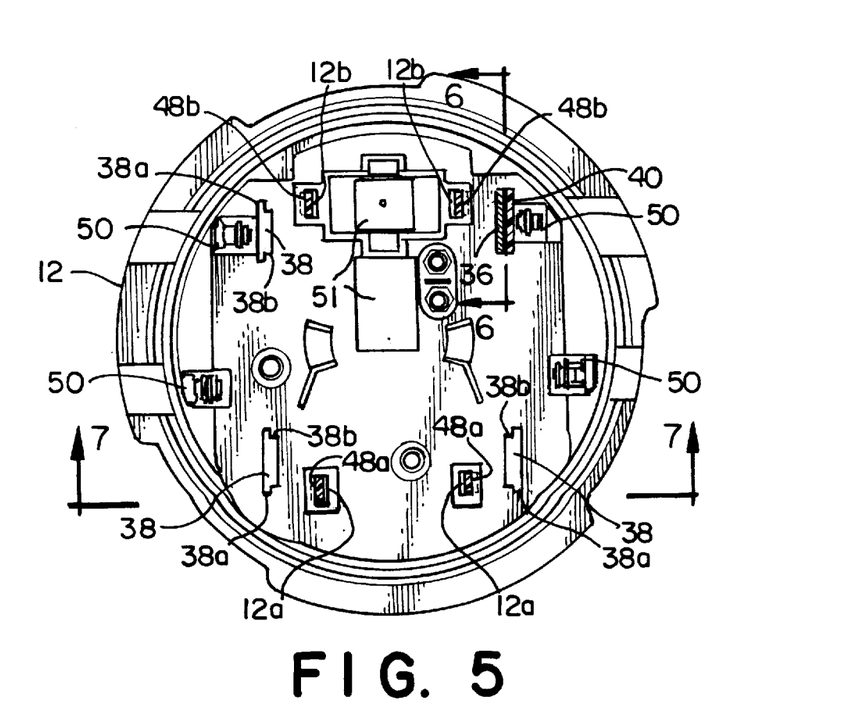
FIG. 5 is a rear plan view of the base shown in FIG. 3.

Referring to FIGS. 3 and 4 it will be seen that the retainer 18 in addition to including the four meter retainer lock keys 40 also includes a central blade 42, best seen in FIG. 4. The retainer 18 is molded from a reinforced, flame-retardant thermoplastic material. The retainer 18 provides electrical insulation via the central blade 42 referred to as an insulation blade post that extends down through the current sensor 32, FIG. 3, between the current conductors 34. The insulation blade post 42 provides the required electrical insulation between the conductors bare copper wires 34, 34 and requires no additional insulation on the wires.

Figure 4A:
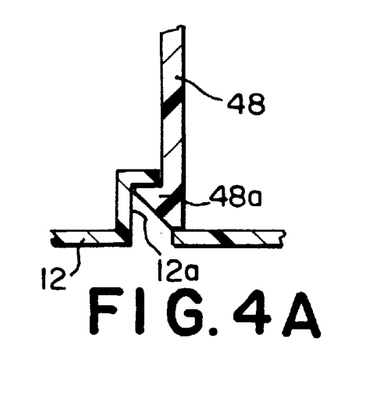
FIG. 4A is a sectional view on enlarged scale of the snap barb and sealing receptacle shown in FIG. 7.
Figure 4B:
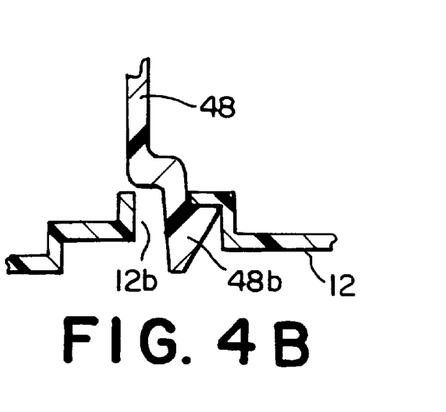
FIG. 4B is a sectional view on enlarged scale of the snap barbs shown in FIG. 4.
Figures 6, 7:
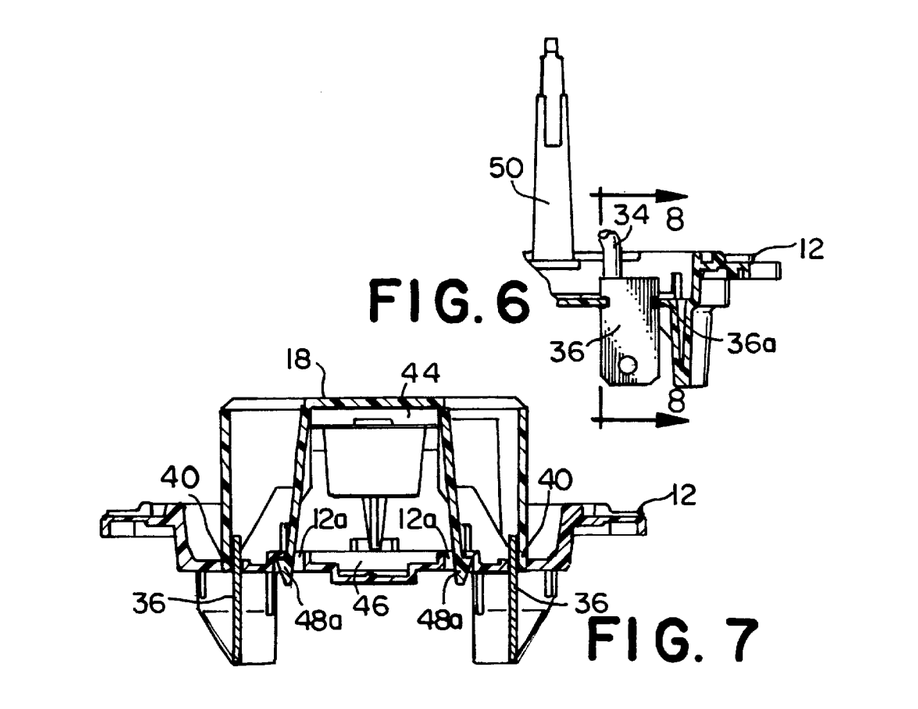
FIG. 6 is a sectional view of a meter blade taken along the lines 6—6 in FIG. 5.
FIG. 7 is a sectional view of the base and retainer taken along the line 7—7 in FIG. 5.

Also located on the retainer 18 is a universal transformer-mounting nest 44, FIG. 4, located between two snap posts 48. The universal transformer-mounting nest 44 is unique because it includes dual-levels that allows two different sized power transformers to be used with the same meter parts. The nest areas or pockets 44 molded into the retainer 18 are mirrored or repeated at 46 in the meter base 12, FIG. 7 to ensure the secure mount for the power supply transformer 16. The retainer 18 is mounted in the meter base 12 by four legs or snap posts 48, FIG. 4, the ends of which serve as filler plugs for the meter blade-base retention system. See FIG. 7. Referring to FIGS. 4, 4A, 4B and 7 it will be seen that the snap posts 48 have a selected configuration 48a, 48b at the end of the posts that effectively closes the openings in the base 12 after the snaps are engaged. This is best seen in FIGS. 4A, 4B and FIG. 7. The end of each post 48 is a hook-like offset in the axis or snap barb 48a, FIG. 4a, or 48b, FIG. 4B. that creates a ledge to seal the opening or snap receptacle 12a, FIG. 4A, or 12b, FIG. 4B in the base 12 after assembly. The snap barbs 48a are used at a upper level in the meter base 12 and the snap barbs 48b are used at a lower level in the meter base 12. Temperature changes and condensation inside prior electrical energy meters are regulated by an attached breathing vent. The vent opening is covered with a filter that blocks particles and insects. The fit between the snap barbs 48a and 48b that penetrate the meter base 12 are shaped to block dust, particles, and insects while permitting the correct amount of air exchange between the inside and outside of the meter 10. This feature is an improvement over prior designs because it eliminates parts and lowers the cost.

The combination of secured base and retainer for solid state or electormechanical residential electrical energy meters forms a snap fit construction. The snap fit construction consists of the cantilevered beam or post 48 with the hook-like offset or barb 48a or 48b supported at one end by the meter retainer 18. Deflection occurs at the free end of the beam or snap post 48. The mechanical load on the free end accepts the maximum deflection. The barbs 48a or 48b at the end of the snap post 48 acts as a cam surface, which is sufficiently flexible to spring into place in the snap receptacle 12a, 12b, yet strong enough to support the mechanical load.

Figures 11, 11A:
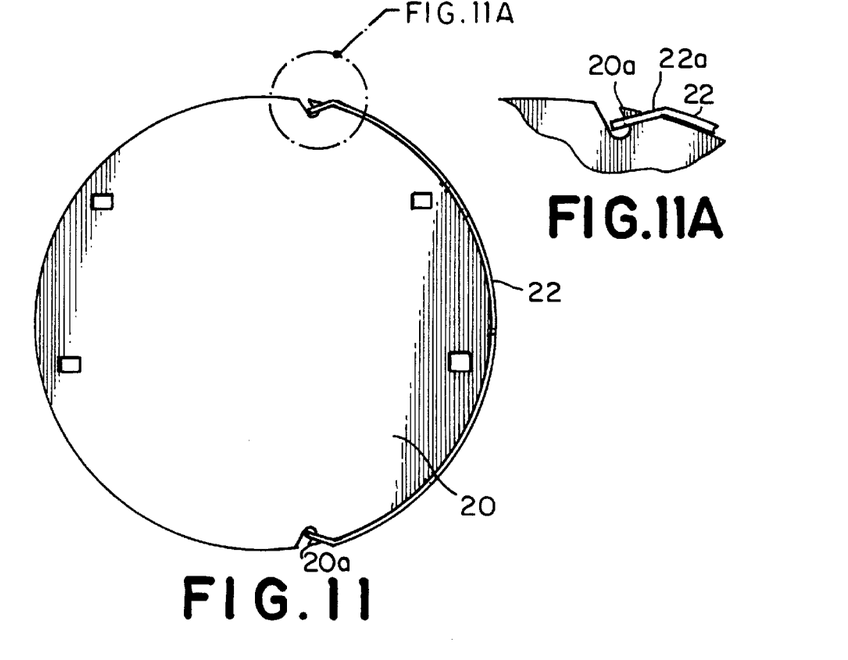
FIG. 11 is a plan view of the circuit board.
FIG. 11A is a fractional view on enlarged scale of the bulls eye area FIG. 11A in FIG. 11.

Referring to FIGS. 11 and 11A it will be seen that the radio communications antenna 22 is mounted on the edge of the radio circuit board 20. In prior art electrical meters, the antenna is normally mounted on the meter cover. This requires a long lead wire to connect the radio circuitry to the antenna. During assembly the lead wire must be carefully folded up and routed to avoid damage. In the present electrical energy meter 10 the antenna 22 is mounted on the edge of the radio circuit board 20. Notches 20a are cut into the edge of the circuit board 20, FIGS. 11 and 11A. The ends of the antenna 22 are provided with holes 22a to receive the notches 20a. Because the antenna 22 is made of flexible circuit material (like polycarbonate, polyester, or polyamide) the radio communications antenna 22 is easily mounted by matching the holes on the antenna with the hook notches on the circuit board, FIG. 11A. This method of attaching the radio communications antenna has several advantages over prior art designs. The antenna remains with the circuit board as a unit, simplifying the assembly procedure. The connection between the antenna and the radio circuitry is shorter, improving performance and reducing parts costs. The antenna can be designed with wide elements to reduce the critical tuning characteristic of most wire-type loops. The antenna lead wire present in prior art meter designs is eliminated completely, cutting down on parts, costs, and risk of damage.

Figure 12:
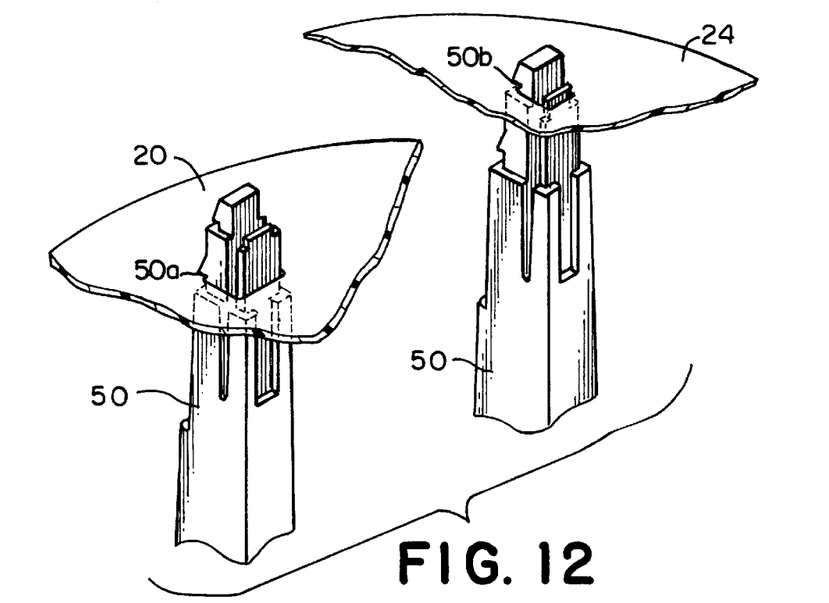
FIG. 12 is a fractional view showing two of the snap posts and the double level snap structure for the name plate and circuit board.

Another feature of the present invention is the circuit board/name plate mounting system as illustrated in FIG. 12. As shown in FIGS. 1 and 3, the base 12 is provided with four dual-purpose snap posts 50. These posts 50 are adapted to support the circuit board 20 and the radio communications antenna 22. In order to utilize space most efficiently, the same snap posts 50 also support the name plate 24 by reason of the double-level snap design. The snap posts 50 include snap structure 50a, FIG. 12, at a lower level for supporting the circuit board 20 and snap structure 50b at an upper level for supporting the name plate 24. The dual-purpose snap posts 50 provide sufficient vertical support and protection for the circuit board 20 and the circuit board/name plate mounting system utilizes the meter cover 26 to provide additional horizontal support and protection. It eliminates the risk of damage due to a major side impact load. This is accomplished by sizing the circuit board 20 to have only a small amount of clearance between the round circuit board and the inner circumference of the round cover 26. The thermoplastic cup-shaped cover 26 is provided with a rim at the open end thereof, FIG. 1 having cam structure 26a distributed around the inner periphery of the rim. The base 12, FIG. 3, also has cam structure 12c on the periphery thereof for cooperation with the cam structure 26a on the rim on the cover 26. The cam structure 12c on the base 12 is inclined for engaging the cam structure 26a on the cover locking the cover 26 to the base 12 when the cover is twisted relative to the base to enclose the name plate, the antenna, the circuit board, the current sensor assembly, the transformer and the retainer therebetween.

Figure 13:
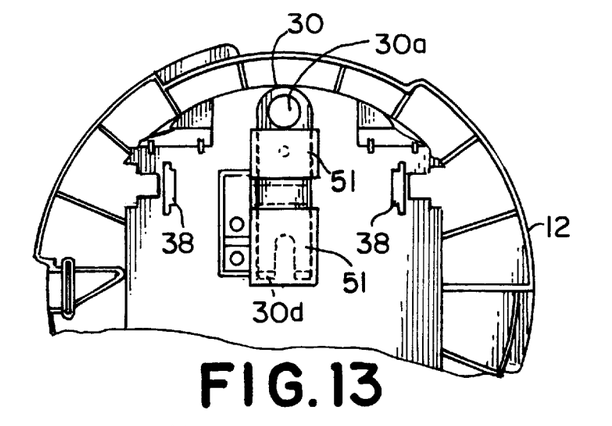
FIG. 13 is a fractional bottom view of the base showing the hanger in retracted position.
Figure 14:
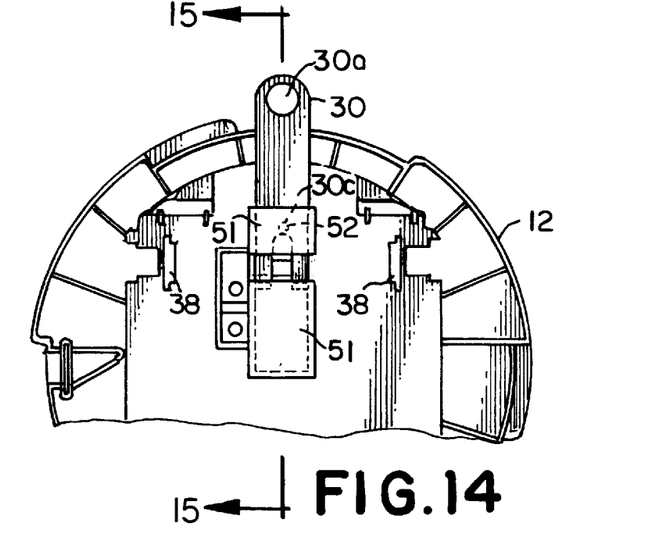
FIG. 14 is a view similar to FIG. 13 with the hanger in extended position.
Figure 15:
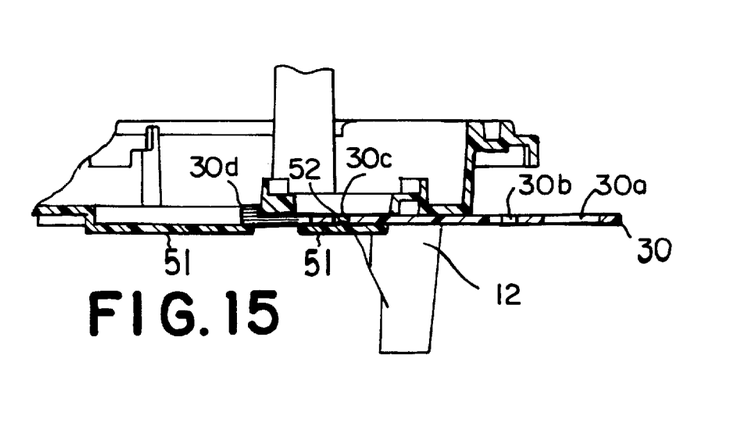
FIG. 15 is a sectional view taken along the lines 15—15 in FIG. 14.

The ANSI C12.10 standard requires that solid state residential electrical meters have storage provisions when they are not inserted into the meter socket. The meter 10 of the present invention is provided with a new one-piece retractable hanger 30 which is installed from inside the meter base 12. As may be seen in FIG. 5 the meter base 12 is provided with a hanger receptacle 50 in the bottom thereof and having openings through which the hanger 50 is adapted to slide, FIGS. 13–15. The hanger 30 has a relatively large finger hole 30a at the outer end thereof so that it may be pulled in and out of the meter base 12. The hanger receptacle 50 includes a detent bump 52 which aligns with either of two holes 30b, 30c in the retractable hanger 30 to provide positive extended and retracted position locations. The inner end of the hanger 30 is provided with a shoulder 30d which prevents the hanger 30 from being fully withdrawn from the base when in the extended position. The detent bump 52 is a tactile, retractable position-signaling device that causes the hanger 30 to lock into a full open or full closed position. The one piece retractable hanger 30 is used to safely store and transport the meter 10 and satisfies all ANSI requirements for precision electronic instruments. The hanger 30 preferably is molded from a reinforced thermoplastic material.

As pointed out above the retractable hanger 30 is installed by sliding it into the hanger receptacle 50 located on the inside of the meter base 12. It is believed to be the first hanger manufactured in one piece to be assembled on the inside of the meter. This unique feature lends itself to a more ideal automatic assembly process where all parts are assembled from one side of the meter base. In a high volume production environment, it is advantageous to eliminate the extra installation step of turning over the meter to install the hanger. The new hanger design reduces the number of parts normally required for the hanger, simples the assembly process and is more cost effective than conventional designs.

The retainer 18 is molded from a reinforced flame retardant thermoplastic material and is a single unique multipurpose part. The retainer 18 serves as a mounting device for the power supply transformer 16, the electrical insulator between the current conductors 34 and the blade keys 40 that lock the meter blades 36 into the meter base 12.

From the foregoing it will be seen that the electrical energy meter 10 of the present invention incorporates numerous unique design features which allow the meter to function for its intended purpose while significantly reducing the number of parts, simplifying the assembly and reducing overall product and manufacturing costs. Solid state and electromechanical residential electrical meters of the prior art frequently number as many as 220 different parts. In the present invention the meter consists of 12 unique parts. The number of fasteners required on a prior art solid state electromechanical residential electrical energy meter (D5 meter manufactured and sold by ABB assignee of the present application) number as many as 42. The electrical energy meter 10 of the present invention requires no screws or fasteners. The electrical energy meter of the present invention makes the best utilization of the available space while keeping the construction simple, yet strong enough to meet all mechanical requirements. The snap fit interlocking part concept of the present invention allows a compact assembly and provides a meter which is several inches smaller than comparable meters. The use of the four dual-purpose snap posts integrated into the meter base allows the main circuit board to be mounted without screws and the meter name plate to be simply snapped into place over the same posts. The basic chassis components are nested in the meter base behind the circuit board and name plate. This construction allows the current conductors to be short. The current conductors are designed so that only one wire design shape is needed for the left-and right-end conductors, which reduces the number of different parts needed.

Figure 16:
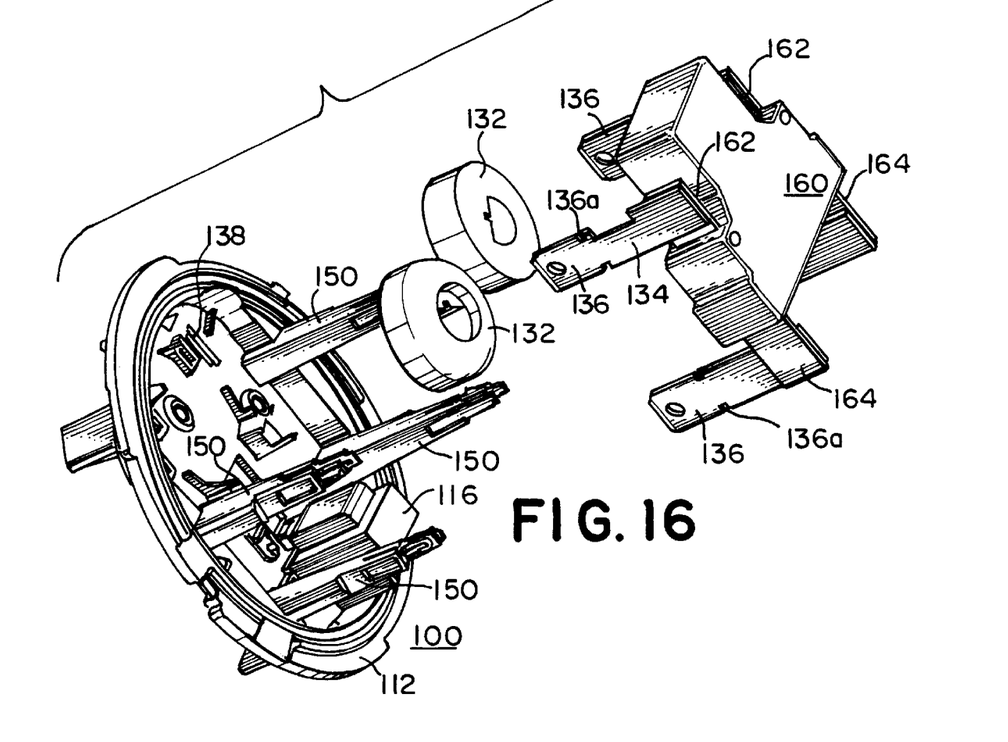
FIG. 16 is an exploded perspective view of a modification of the present invention.
Figure 17:
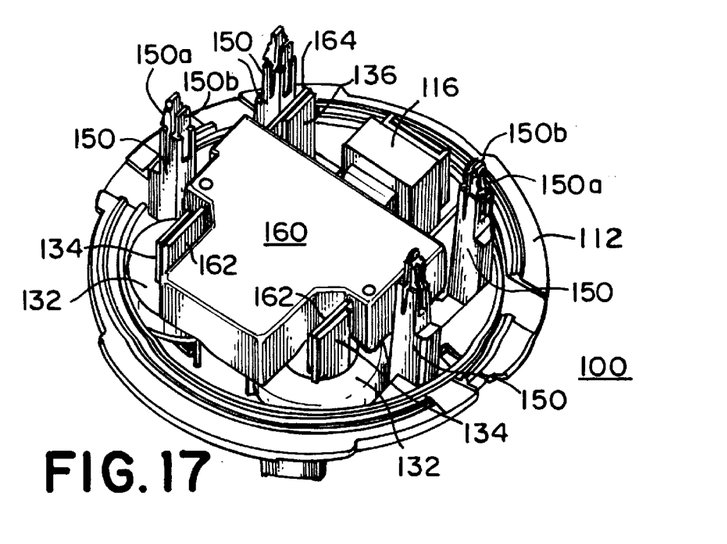
FIG. 17 is an assembly view of the parts illustrated in FIG. 16.

Referring to FIGS. 16 and 17 there is illustrated a modification of the present invention. The meter 100 shown in FIGS. 16 and 17 is similar to the meter 10 shown in FIG. 1 and includes many of the same parts. The basic difference in the meter 100 and the meter 10 is the omission of the retainer 18 and the different construction of the current sensor assembly. The meter 100 is designed to incorporate a total service disconnect switch within the meter. A total service disconnect service enables utility companies to control power supply to a residence where service can be interrupted or restored for an entire house. A disconnect switch is required to handle enormous amounts of power (40,000 watts) during this type of procedure. Referring to FIGS. 16 and 17 it will be seen that the meter 110 includes a base 112 molded from a thermoplastic material. The base 112 is similar to the base 12 in FIG. 1 and includes keyhole slots 138, only one shown in FIG. 16, which are adapted to receive the respective meter blades 136. The meter blades 136 are provided with spaced notches 136a for locking the meter blades within the keyhole slots 138. The meter blades 136 have integral therewith extensions or current conductor portions 134a which are connected to switch connections of a disconnect switch 160. The narrow end of the disconnect switch 160 is provided with switch connections 162 which are attached to the conductor portions 134 of the corresponding switch blades 136, FIG. 16. As may be seen in FIG. 17, the conductor portions 134 extend through the central openings in the annular current sensors 132. The other switch connections 164 are attached to the rear meter blades 136. As may be seen in FIGS. 16 and 17 the meter blades 136 have an extended length which includes the conductor portion 134 for extending through the current sensors 132 that are mounted between the switch 160 and the meter base 112. The length of the blades 136 is sufficient to allow the current sensing devices 132 to nest between the switch 160 and the meter base 112. By using two current sensors 132, one around each of the two load-side meter blades 136, the metering circuits can electronically measure the current. This eliminates the need to "cris-cross" the current conductors to a single sensor as done in the prior art.

The remaining parts of the meter 100 are the same as the remaining parts of the meter 10 shown in FIG. 1. The meter base 112 includes four snap posts 150 which are identical to the snap posts 50 in FIGS. 1 and 12. The snap posts 150 include snap structure 150a at a lower level for supporting a circuit board and snap structure 150b at an upper level for supporting a name plate similar to the arrangement illustrated in FIG. 12. The meter 100 also includes the transformer 116, a retractable hanger, a radio communications antenna, a sealing ring and a thermoplastic cup shaped cover as shown in FIG. 1 to complete the electrical energy meter assembly.

While there has been described a preferred embodiment of the invention, it will be understood that further modifications may be made without departing from the spirit and scope of the invention as set forth in the appended claims.

What is claimed is:

1. An electrical energy meter with snap fit interlocking parts for ease in assembly comprising a current sensor assembly comprising an annular current sensor having a central opening, a plurality of current conductors extending through the central opening in said current sensor, and a plurality of meter blades attached to the ends of said current conductors, each of said meter blades having notches on opposite edges thereof; a thermoplastic meter base having a plurality of keyhole slots therethrough corresponding to the plurality of meter blades, each of said slots having a first section shaped to receive a meter blade and an adjacent narrow section shaped to receive the spaced notches on the meter blades to prevent the meter blades from moving axially of the base; a thermoplastic retainer having a plurality of meter blade lock keys shaped to fit within the first sections of said plurality of slots through said meter base, two pairs of thermoplastic snap posts projecting from said retainer and positioned between opposed pairs of meter blade lock keys, each of said retainer snap posts having hook shaped ends adapted to snap fit within corresponding openings in said meter base to lock said retainer and said meter base together, an insulation blade post projecting from a central portion of said retainer for extension through said current sensor and between said current conductors to provide electrical insulation between said current conductors, said meter base having a plurality of integral posts projecting therefrom and extending through corresponding openings in said retainer, said base posts having first and second level snap structure adjacent the outer ends thereof, said first level snap structure shaped to support a circuit board of said electrical energy meter and said second level snap structure shaped to support a name plate, a circuit board supported on said first level snap structure, a name plate supported on said second level snap structure, a pair of spaced notches on the periphery of said circuit board, and a radio communications antenna having openings in the opposite ends thereof for attachment to said notches on the periphery of said circuit board.

2. An electrical energy meter according to claim 1 including a thermoplastic cup-shaped cover having a rim at the open end thereof, said base having inclined cam structure on the periphery thereof for cooperation with said rim on said cover, said rim having cam structure for engaging said inclined cam structure on said base for locking said cover to said base when said cover is twisted relative to said base to enclose said name plate, said antenna, said circuit board, said current sensor assembly and said retainer therebetween.

3. An electrical energy meter according to claim 2 including an annular sealing gasket positioned between the rim of said cover and the periphery of said base.

4. An electrical energy meter according to claim 1 wherein said base includes a hanger receptacle, an opening in the side of said base for slidably receiving a hanger, a hanger inserted in said hanger receptacle and having spaced detent structure for cooperating with decent structure on said base to control the position of said hanger with respect to said base.

5. An electrical energy meter according to claim 1 wherein said retainer includes a transformer mounting nest positioned between one of said pair of retainer posts and a transformer mounted within said mounting nest.

6. An electrical energy meter according to claim 1 wherein said retainer includes a first transformer mounting nest located between one of said pairs of retainer posts, a second transformer mounting nest located between one of said pairs of retainer posts, and a transformer mounted in one of said transformer mounting nests.

7. An electrical energy meter according to claim 6 wherein said transformer mounting nests are located at different elevations within said retainer to accommodate transformers of different sizes.

8. An electrical energy meter with snap fit interlocking parts for ease in assembly comprising a current sensor assembly comprising at least one annular current sensor having a central opening, a plurality of current conductors, at least one current conductor extending through the central opening in said current sensor, and a plurality of meter blades attached to said current conductors, each of said meter blades having notches on opposite edges thereof; a thermoplastic meter base having a plurality of keyhole slots therethrough corresponding to the plurality of meter blades, each of said slots having a first section shaped to receive a meter blade and an adjacent narrow section shaped to receive the spaced notches on the meter blades to prevent the meter blades from moving axially of the base; said meter base having a plurality of integral posts projecting therefrom, said base posts having snap structure adjacent the outer ends thereof, said snap structure shaped to support a circuit board of said electrical energy meter, a circuit board supported on said snap structure, a pair of spaced notches on the periphery of said circuit board, and a radio communications antenna having openings in the opposite ends thereof for attachment to said notches on the periphery of said circuit board.

9. An electrical energy meter according to claim 8 including two annular current sensors wherein each of said meter blades is integral with one of said current conductors, a disconnect switch mounted on said base between said base posts and said disconnect switch having switch connections to said current conductors at a location remote from said meter blades.

10. An electrical energy meter according to claim 9 wherein said current conductors form an extension of said meter blades.

11. An electrical energy meter according to claim 10 including a transformer mounted on said base adjacent said disconnect switch.

12. An electrical energy meter according to claim 8 wherein said base posts have first and second level snap structure, said first level snap structure shaped to support said circuit board of said electrical energy meter and said second level snap structure shaped to support a name plate, and a name plate supported on said second level snap structure.

13. An electrical energy meter according to claim 8 including a thermoplastic retainer having a plurality of meter blade lock keys shaped to fit within the first sections of said plurality of slots through said meter base, two pairs of thermoplastic snap posts projecting from said retainer and positioned between opposed pairs of meter blade lock keys, each of said retainer snap posts having hook shaped ends adapted to snap fit within corresponding openings in said meter base to lock said retainer and said meter base together, and an insulation blade post projecting from the central portion of said retainer for extension through said current sensor and between said current conductors to provide electrical insulation between said current conductors.

14. An electrical energy meter according to claim 8 including a thermoplastic cup-shaped cover having a rim at the open end thereof, said base having inclined cam structure on the periphery thereof for cooperation with said rim on said cover, said rim having cam structure for engaging said inclined cam structure on said base for locking said cover to said base when said cover is twisted relative to said base to enclose said antenna, said circuit board, and said current sensor assembly therebetween.

15. An electrical energy meter according to claim 14 including an annular sealing gasket positioned between the rim of said cover and the periphery of said base.

* * * * *